United States Patent [19]

Harrington

[11] Patent Number: 5,602,468

[45] Date of Patent: Feb. 11, 1997

[54] METHOD AND APPARATUS FOR ION CHAMBER IDENTIFICATION

[75] Inventor: Tim Harrington, Monrovia, Calif.

[73] Assignee: Radcal Corporation, Monrovia, Calif.

[21] Appl. No.: 512,067

[22] Filed: Aug. 7, 1995

[51] Int. Cl.⁶ .......................... G01R 27/26; G01N 27/22
[52] U.S. Cl. ........................ 324/71.1; 324/658; 250/375
[58] Field of Search ................................. 324/658, 677, 324/678, 71.1, 601; 364/571.01, 571.07; 250/374, 375; 315/111.01

[56] References Cited

U.S. PATENT DOCUMENTS 5,080,765  1/1992  Wang et al. ...................... 204/152.1
5,095,217  3/1992  Attix ...................................... 250/374

Primary Examiner—Kenneth A. Wieder
Assistant Examiner—Diep Do
Attorney, Agent, or Firm—J. E. Brunton

[57] ABSTRACT

An apparatus for determining the characteristics of a particular ionization chamber by measuring the capacitance of the chamber and using that capacitance to identify the particular type of chamber being used to measure the ionizing radiation.

12 Claims, 1 Drawing Sheet

5,602,468

METHOD AND APPARATUS FOR ION CHAMBER IDENTIFICATION

BACKGROUND OF THE INVENTION

1. Field of the Invention

The present invention relates generally to the measurement of ionizing radiation through the use of an ionization chamber. More particularly, the invention concerns a novel apparatus for determining the characteristics of a particular ionization chamber by measuring the capacitance of the chamber and using that capacitance to identify the particular type of chamber being used to measure the ionizing radiation.

2. Discussion of the Invention

In the simplest form, an ion chamber is merely a closed chamber containing an ionizing gas. Ionizing radiation, such as X-rays, gamma rays or charged particles interact with the gas in the ion chamber to produce ions. Typically, the ion chamber is connected to a read-out unit containing a bias supply which is used to establish an electric field within the ion chamber. The ions produced within the chamber are collected by the electric field and flow in an external circuit which typically comprises the bias supply and an electrometer. The electrometer functions to convert the small current within the ion chamber into an electrical signal that can be processed into values suitable for display by a display means such as a controller. As a general rule, this conversion includes allowance for sensitivity of the ion chamber and the electrometer. Calibration and identification information is used by the read-out to convert the electrical signal from the electrometer into units of radiation such as Roentgens. The Roentgen is generally defined in coulombs per unit volume of air at standard temperature and pressure.

Prior art ion chambers are of various sizes, shapes and sensitivities. For example, small volume ion chambers are typically used to measure intense radiation, while larger volume chambers are used to measure low level radiation. In like manner, very compact chambers are useful for measuring radiation with a small spacial extent, while paddle shaped chambers are often used for measuring radiation in a specific area. In both cases, parallel plane and cylindrical geometries can be employed.

A wide variety of materials are used in the construction of prior art ion chambers. For example, thin-window chambers are needed to measure low-energy radiation while thicker wall chambers may be required for higher energy measurements. While not all prior art ion chambers are gas filled, the sensitivity of gas filled ion chambers depends directly on the amount of gas within the chamber. In this regard, the sensitivity of prior art ion chambers varies substantially and volumes of prior art ion chambers can range between 0.1 cubic centimeters and 10 liters.

It is fundamental that in order for the read-out unit of the radiation measuring apparatus to accurately display the results of a measurement in radiation units, the sensitivity of the particular ion chamber to which the read-out unit is connected must be determined and appropriately entered. Frequently, this is done by the operator manually entering the sensitivity of the particular ion chamber being used in coulombs per Roentgen. Entering the sensitivity in this manner is both time consuming and prone to error. Another method sometimes used to enter the chamber sensitivity into the read-out unit is through the use of a coding means in the form of a wired connector or a coding resister which forms a part of the read-out itself. This approach lessens the time required to enter the sensitivity data, but involves a more complex electrical connection and requires additional circuitry to measure the coding.

The thrust of the present invention is to overcome the drawbacks of prior art radiation measuring apparatus as described in the preceding paragraph. More particularly, the present invention provides a novel means for identifying the specific type of ion chamber involved by first measuring the charge produced as the bias voltage on the chamber is varied in a known way and then using this information to identify the chamber type. This vastly simplifies the ion chamber by completely eliminating the need for coding wires or components. This, in turn, simplifies the design of the read-out unit since the unit does not have to respond to any coding arrangements.

SUMMARY OF THE INVENTION

It is an object of the present invention to provide a novel apparatus for use in determining ionization chamber type by measurement of the capacitance of the ion chamber. More particularly, it is an object of the invention to provide such an apparatus which does not require any special coding of the ion chamber.

Another object of the invention is to provide an apparatus of the aforementioned character which is uniquely designed to make use of the bias supply and charge measurement circuit already present in the instrument under consideration.

Another object of the invention is to provide an apparatus of the type described in the preceding paragraphs in which capacitance of the ion chamber is measured by measuring the charge produced as the bias voltage changes between two known values.

Another object of the invention is to provide an apparatus for determining ion chamber type in which capacitance is determined by measuring the current produced as the bias voltage changes at a known rate.

Another object of the invention is to provide a method for identifying chamber type in which, following the determination of the capacitance of the chamber, the capacitance determined is compared with capacitance values for various chambers and the chamber type with the matching capacitance is selected. Once the chamber type is identified, the sensitivity and other characteristics of the chamber type can readily be determined.

Another object of the invention is to provide a method in which the identity of the chamber determined from the capacitance measurement is optionally displayed, so as to allow the user, to either accept this chamber type, or to select another chamber. In accordance with one form of the method of the invention, once this alternate selection has been made, the table is updated so that subsequent measurements that return this capacitance value (within a predetermined tolerance) will be identified as the alternate chamber.

DETAILED DESCRIPTION OF THE INVENTION

Figure 1:
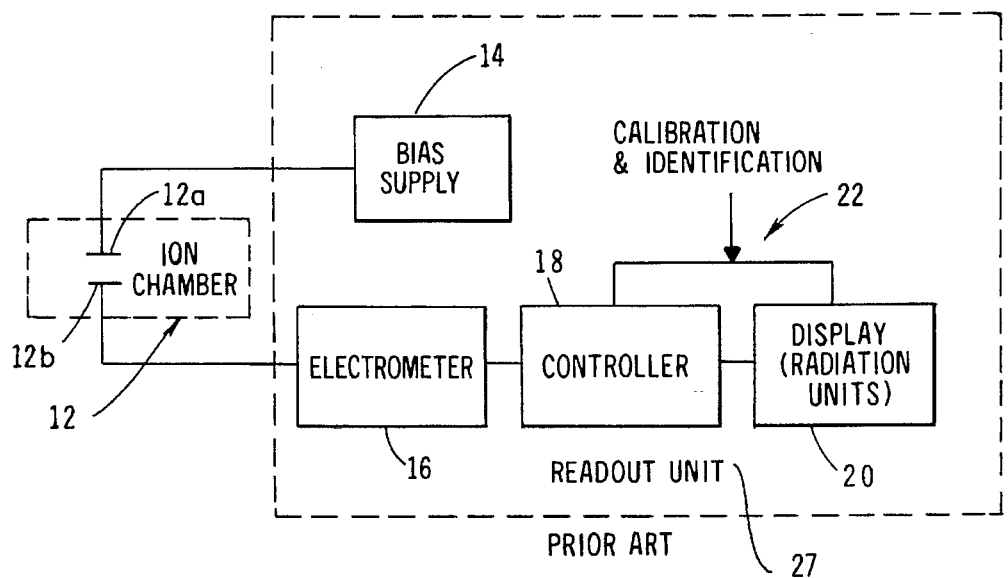
FIG. 1 is a generally schematic, or block diagram view of a typical prior art ion-chamber-based radiation monitoring instrument.

Referring to the drawings and particularly to FIG. 1, the prior art ion chamber based radiation monitoring instrument there shown comprises an ion chamber 12 to which a bias supply 14 and an electrometer 16 are operably interconnected.

Ion chamber 12 produces a current that is proportional to the radiation present in the sensitive volume. It consists of a bias electrode 12a and a signal electrode 12b that define a sensitive volume between them. The ion chamber has a capacitance determined by the geometry of these electrodes. Typically, the ion chamber produces current in the range of 10 fA to 10 nA. It is to be understood that chamber 12 may be sealed or unsealed and need not be gas filled. Bias supply 14 produces the voltage necessary for operation of the ion chamber. This voltage is typically 50 to 500 volts.

Figure 2:
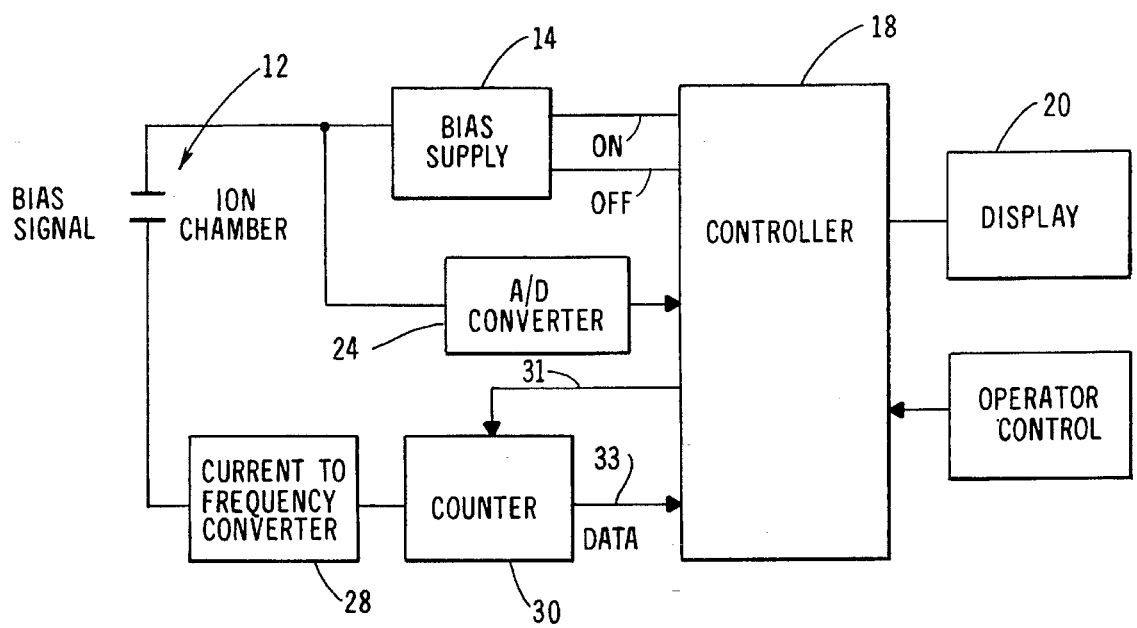
FIG. 2 is a generally schematic or block diagram view of one embodiment of the ion chamber identification apparatus of the present invention.

Turning also to FIG. 2, the apparatus of one form of the present invention is there illustrated. As indicated in FIG. 2, the bias supply 14 is controlled by a controller 18 which is connected to a display 20 for displaying radiation units. The "off" control signal programs the supply to output zero volts, and connects a load to the supply in order to discharge the supply within seconds. The "on" control signal removes the load and allows the supply to start operation. Supply 14 is designed to turn on with a known time constant, increasing smoothly from near zero volts to the operating voltage. It should be noted that the bias supply 14 could be a battery and a switch, since it is not necessary that the supply turn on smoothly. An analog to digital converter 24 is interconnected between the bias supply and the controller. Converter 24 could also take the form of a fixed-threshold monitor circuit. In either case the apparatus functions to measure the output of the bias supply when commanded to do so by the controller. Preferably converter 24 provides a resolution of 0.1% which can be provided by a 10-bit a/d converter.

Referring once again to FIG. 1, the prior art construction there illustrated can be seen to include a calibration and identification means 25 and a read-out unit 27 comprising bias supply 14, electrometer 16, controller 18, display 20 and the calibrated identification means 22.

Turning to FIG. 2, it is to be noted that a current to frequency converter 28 and a counter 30 are interposed between the chamber 12 and controller 18. The current to frequency converter 28 functions to produce pluses at a rate proportional to the input current with each pulse corresponding to a known amount of charge.

Accordingly, the number of pulses corresponds to the total charge from the ion chamber, and the frequency of the pulses corresponds to the current from the ion chamber. With this construction, counter 30 functions to count the pulses from current to frequency converter 28 when the controller signals enable that counting via connection 31, The controller can read the counter at any time via connection 33. It is to be understood that the current to frequency converter 28 and the counter 30 could be replaced by a capacitive-feedback electrometer of a character well-known in the art.

In the operation of the apparatus of the invention, the controller provides the control signals and performs an algorithm that relates the measured charge to a chamber type. It uses the measured charge to select a table entry that includes the sensitivity of the ion chamber as well as other information about the chamber such as a descriptive name and information about performance characteristics. The controller function is preferably implemented using a microprocessor in a manner well known by those skilled in the art. In this regard, it is to be noted that the controller could be a dedicated logic system or could be implemented as software in a general purpose computer.

As previously mentioned, during operation, display unit 20 produces a read-out of the radiation detected by the ion chamber in appropriate units such as Roetgens. In the form of the invention shown in FIG. 2, the display unit can also display operational status information such as the chamber type. In this regard it should be noted that the display need not be a physical display, but can also be a serial connection to another computer, or any other suitable means for recording the results of a measurement.

In using the apparatus to carry out the method of the invention, the controller first assures that the bias voltage applied to the ion chamber is less than a first threshold voltage as, for example, 10% of the operating bias voltage. This is accomplished by sending an "off" signal to the bias supply and waiting a predetermined time determined by the design of the bias supply and associated circuits. In the present form of the method of the invention about three to six seconds is sufficient.

Next, using the "on" control the bias supply 14 is activated as is the voltage detection means. This done, the bias supply output is modulated and the modulation of the current produced at the signal electrode is periodically measured. (For example, once every millisecond.) When this output reaches a second threshold voltage, (which should be greater than or equal to the first threshold voltage) as for example, ten percent (10%) of the bias voltage, counting of the pulses from the current to frequency converter 26 is commenced. When a third threshold voltage is reached, as for example, eighty percent (80%) of the bias voltage, counter 28 is turned off and the number of pulses that occurred between the time the second voltage was reached and the third voltage was reached, is determined. this number corresponds to the charge produced by a known voltage across the chamber capacitance and thus the charge is related to the chamber capacitance. Finally, using a table of chamber types, the measured charge thusly determined is used to select one entry appearing in the table. As previously discussed, the user is given the opportunity to confirm the chamber type selection or to alter it. This confirmation and opportunity for altering the chamber type allows the apparatus of the invention to be used in conjunction with ion chambers of different types that have nearly equal capacitances.

In an alternate form of the method of the invention, wherein the bias supply controls the rate of charge of voltage applied to the chamber, the steps of the method comprise the following:

First, the controller assures that the voltage on the chamber has fallen to a small value, as for example, one percent (1%) of the nominal bias voltage. This is accomplished by turning off the bias supply and waiting a predetermined time, as for example ten seconds (10). Next using the "on" control, the bias supply 14 is activated.

After a short lapse time of about one second, the current flowing from the chamber is determined by measuring the frequency of the pulses produced by the current flowing to the frequency converter in the manner described herein in connection with the first embodiment. This done, reference is made to the table of chamber types and the measured current is used to select one entry in the table. Once again, the operator is permitted to confirm the chamber type selection or to alter it. As before, this confirmation and opportunity for altering the chamber type allows the apparatus of the invention to be used in conjunction with ion chambers of different types that have nearly equal capacitances.

It is to be appreciated that the volume and other characteristics of the selected chamber type as determined in accordance with the method of the invention can be used in subsequent measurement calculations.

Having now described the invention in detail in accordance with the requirements of the patent statutes, those skilled in this art will have no difficulty in making changes and modifications in the individual parts or their relative assembly in order to meet specific requirements or conditions. Such changes and modifications may be made without departing from the scope and spirit of the invention, as set forth in the following claims.

I claim:

1. A method of identifying a particular type of ion-chamber having a bias electrode and a signal electrode; the method comprising the steps of:

(a) measuring the capacitance between the electrodes;

(b) comparing the capacitance thus measured to a listing of various ion chambers to identify the ion chamber having a capacitance comparable to the measured capacitance.

2. A method as defined in claim 1 including the further step of following the identification of an ion chamber having a capacitance comparable to a listed ion chamber, allowing an operator to select an ion chamber from the list and updating the list using that selection thereby facilitating automatic identification of chambers with similar capacitances.

3. A method of identifying a particular type of ion chamber having a bias electrode that is interconnected with a bias supply having an operating voltage that can be modulated and a signal electrode interconnected with a current-measuring means, the method comprising the steps of:

(a) modulating the output of the bias supply;

(b) measuring the modulation of the current produced at the signal electrode in response to said modulation;

(c) determining the capacitance between said electrodes from the predetermined modulation of the bias voltage and the measured modulation of said current; and (d) comparing the capacitance thus measured to a listing of capacitances of various ion chambers to identify the ion chamber having a capacitance comparable to the measured capacitance.

4. A method of identifying a particular type of ion chamber having a bias electrode that is interconnected with a bias supply having an operating voltage that can be energized and de-energized and a signal electrode interconnected with a charge-measuring means, the method comprising the steps of:

(a) de-energizing the bias supply until the bias voltage is below a first level;

(b) re-energizing the bias supply until the bias voltage reaches a second level, equal to or greater than the first level;

(c) integrating the charge produced at the signal electrode until the bias supply reaches a third level;

(d) determining the capacitance from the measured charge and change in voltage between said second and third levels, and;

(e) comparing the capacitance thus measured to a listing of capacitances of various ion chambers to identify the ion chamber having a capacitance comparable to the measured capacitance.

5. A method as defined in claim 4 in which charge integration is performed using a current-to-frequency converter and a digital counter, said digital counter being used to determine the number of pulses emitted by the current-to-frequency converter during the time the bias voltage is moving from said second level to said third level.

6. A method as defined in claim 4 in which integration is performed using a capacitive-feedback electrometer, said electrometer being operative starting with said second level voltage and ending with said third level.

7. A method as defined in claim 4 where the determination of said second and third levels is performed by periodically comparing the bias supply voltage with the predetermined threshold voltages.

8. A method as defined in claim 4 where the determination of said levels is performed by periodically performing an analog-to-digital conversion of the bias supply voltage and comparing the digitized result with a predetermined value.

9. A method of identifying a particular type of ion chamber having a bias electrode that is interconnected with a bias supply having an operating voltage that can be energized and de-energized and a signal electrode interconnected with a current-measuring means, the method comprising the steps of:

(a) de-energizing the bias supply until the voltage falls below a first level;

(b) re-energizing the bias supply;

(c) measuring the current produced at the signal electrode when the bias voltage rate of change is predetermined value;

(d) determining the capacitance from the measured current and the known rate of change of the bias voltage; and (e) comparing the capacitance thus measured to a listing of capacitances of various ion chambers to identify the ion chamber having a capacitance comparable to the measured capacitance.

10. A method of identifying a particular type of ion chamber having a bias electrode that is interconnected with a bias supply having a predetermined turn-on behavior so the rate of change of voltage is related to the time after the supply is energized, and a signal electrode interconnected with a current-measuring means, the method comprising the steps of:

(a) de-energizing the bias supply until the voltage falls below a first level;

(b) re-energizing the bias supply;

(c) measuring the current produced at the signal electrode at a predetermined time following re-energizing the bias supply;

(d) determining capacitance from the measured current and the known rate of change of the bias voltage; and (e) comparing the capacitance thus measured to a listing of capacitances of various ion chambers to identify the ion chamber having a capacitance comparable to the measured capacitance.

11. A method as defined in claim 10 where the current measurement is performed using a current-to-frequency converter and a frequency counter.

12. A method as defined in claim 10 where the current measurement is performed using a resistive-feedback electrometer.

* * * * *